(12) United States Patent
Furuya et al.

(10) Patent No.: US 6,407,571 B1
(45) Date of Patent: Jun. 18, 2002

(54) VOLTAGE DETECTING CIRCUIT FOR A POWER SYSTEM

(75) Inventors: Shigeki Furuya; Koji Oka, both of Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/547,614

(22) Filed: Apr. 12, 2000

(30) Foreign Application Priority Data

Apr. 14, 1999 (JP) .......................................... 11-106253

(51) Int. Cl.[7] .............................................. G01R 31/26
(52) U.S. Cl. ...................................... 324/765; 324/158.1
(58) Field of Search ............................... 324/606, 158.1, 324/508, 765; 361/93.2, 96, 98; 701/43; 702/117; 714/724, 14; 700/293, 295, 299

(56) References Cited

U.S. PATENT DOCUMENTS

| 4,093,909 A | 6/1978 | Watrous et al. |
| 5,387,820 A | 2/1995 | Imagawa |
| 5,448,774 A | 9/1995 | Yokozaki et al. |
| 6,085,342 A * | 7/2000 | Marholev et al. ............ 714/724 |

FOREIGN PATENT DOCUMENTS

| DE | 42 33 780 | 4/1993 |
| EP | 0 207 159 | 1/1987 |
| EP | 0 787 993 | 8/1997 |
| JP | 58-002674 | 1/1983 |
| JP | 2-098672 | 4/1990 |
| JP | 05-133985 | 5/1993 |
| JP | 11-006885 | 1/1999 |
| JP | 11-258279 | 9/1999 |
| JP | 11-266148 | 9/1999 |

OTHER PUBLICATIONS

European Search Report dated Aug. 2, 2001 for EP 00 10 7196.

* cited by examiner

Primary Examiner—N. Le
Assistant Examiner—James Kerveros
(74) Attorney, Agent, or Firm—Ratner & Prestia

(57) ABSTRACT

A voltage detecting circuit for detecting a state of a first voltage includes a detection voltage generating circuit for generating a detection voltage depending on the first voltage, a reference voltage generating circuit for generating a reference voltage, a comparison circuit for comparing the detection voltage with the reference voltage and outputting a result of the comparison as a detection signal, and a control circuit for controlling at least one of the detection voltage generating circuit, the reference voltage generating circuit, and the comparison circuit so that at least one of these circuits operates intermittently.

8 Claims, 7 Drawing Sheets

FIG.8

|  | Reference voltage generating circuit | Detection voltage generating circuit | Comparison circuit | Oscillation circuit | Frequency dividing circuit | Overall circuit |
|---|---|---|---|---|---|---|
| Conventional example (Figure 1) | 25 μA | 40 μA | 90 μA | — | — | 155 μA |
| Present invention (Figure 6) | 0.35 μA | 0.3 μA | 0.76 μA | 1.78 μA | 0.86 μA | 4.05 μA |

VOLTAGE DETECTING CIRCUIT FOR A POWER SYSTEM

BACKGROUND OF THE INVENTION

1. Field of the Invention

The present invention relates to a voltage detecting circuit for detecting a state of voltage, such as a power supply voltage detecting circuit.

2. Description of the Related Art

A power supply voltage detecting circuit is widely used in various applications, such as detecting the life of a battery or detecting a capacitor power supply voltage in a backup mode state. The power supply voltage detecting circuit is typically incorporated into a micro computer mainly for portable devices. Moreover, the power supply voltage detecting circuit can also be used for the generation of a reset signal for initialization at power-on or generation of a reset signal for prevention of system runaway when the power supply voltage changes.

A configuration and operation of a conventional power source voltage detecting circuit 10 will be described with reference to FIG. 1. The power source voltage detecting circuit 10 includes a detection voltage generating circuit 11, a reference voltage generating circuit 12, and a comparison circuit 13. The detection voltage generating circuit 11 generates a detection voltage 11a for monitoring a power supply voltage. The reference voltage generating circuit 12 generates a reference voltage 12a which is constant and independent of the power supply voltage. The comparison circuit 13 compares the detection voltage 11a with the reference voltage 12a and outputs the result of the comparison as a comparison circuit output signal 13a. A power supply voltage dividing circuit may, for example, be used as the detection voltage generating circuit 11. A bandgap reference circuit may, for example, be used as the reference voltage generating circuit 12.

FIG. 2 shows signal levels of a power supply voltage V, the detection voltage 11a, the reference voltage 12a, and the comparison circuit output signal 13a with respect to time. In FIG. 2, when the detection voltage 11a is higher than the reference voltage 12a, the comparison circuit 13 outputs the comparison circuit output signal 13a at the same level as the power supply level. The detection voltage 11a is designed to be proportional to the power supply voltage V.

As is seen from FIG. 2, whether the detection voltage 11a is higher than the reference voltage 12a depends on the absolute value of variation in the power supply voltage V. When the detection voltage 11a is higher than the reference voltage 12a, the output of the comparison circuit 13 goes to a HIGH level and outputs the comparison circuit output signal 13a which has the same level as that of the power supply voltage V. When the detection voltage 11a is lower than the reference voltage 12a, the comparison circuit 13 outputs the comparison circuit output signal 13a having a LOW level. This operation allows determination if the power supply voltage V has the HIGH level or the LOW level with respect to a predetermined level.

The power source voltage detecting circuit 10 continuously compares the detection voltage 11a with the reference voltage 12a. The comparison circuit output signal 13a is continuously output from the comparison circuit 13. In other words, in the power source voltage detecting circuit 10, all of the detection voltage generating circuit 11, the reference voltage generating circuit 12, and the comparison circuit 13 are continuously in operation so as to detect the power supply voltage. For this reason, there is a problem that a power supply current required to operate these circuits flows continuously.

A plausible way to solve such a problem is to interrupt the power supply current required to operate the circuits if the comparison circuit 13 outputs the comparison circuit output signal 13a. However, this is not practical since the output of the comparison circuit 13 would also be interrupted. Alternatively, the power supply current required to operate the circuits may be reduced. In this case, however, another problem arises such that the circuits are easily affected by temperature fluctuation and variation of their elements, thereby reducing the detection accuracy.

SUMMARY OF THE INVENTION

According to one aspect of the present invention, a voltage detecting circuit for detecting a state of a first voltage, includes a detection voltage generating circuit for generating a detection voltage depending on the first voltage; a reference voltage generating circuit for generating a reference voltage; a comparison circuit for comparing the detection voltage with the reference voltage and outputting a result of the comparison as a detection signal; and a control circuit for controlling at least one of the detection voltage generating circuit, the reference voltage generating circuit, and the comparison circuit so that at least one of these circuits operates intermittently.

In one embodiment of this invention, the control circuit includes an oscillation circuit for outputting a clock signal.

In one embodiment of this invention, the voltage detecting circuit further includes a frequency dividing circuit for dividing the clock signal output from the oscillation circuit by a factor of N, wherein N is a natural number.

In one embodiment of this invention, the circuit operating intermittently is the comparison circuit.

According to another aspect of the present invention, a voltage detecting method for detecting a state of a first voltage, includes the step of intermittently comparing a detection voltage as a monitor of the first voltage with a reference voltage, and outputting a result of the comparison as a detection signal.

In one embodiment of this invention, a cycle of the intermittent comparing operation is controlled by a clock signal having a predetermined frequency.

Thus, the invention described herein makes possible the advantages of providing a voltage detecting circuit and method having a low power consumption without a decrease in accuracy of voltage detection.

These and other advantages of the present invention will become apparent to those skilled in the art upon reading and understanding the following detailed description with reference to the accompanying figures.

BRIEF DESCRIPTION OF THE DRAWINGS

FIG. 8 is a table for comparing operational power supply currents consumed by the voltage detecting circuit 200 of Example 2 and the conventional voltage detecting circuit shown in FIG. 1.

DESCRIPTION OF THE PREFERRED EMBODIMENTS

A voltage detecting circuit according to the present invention includes a detection voltage generating circuit, a reference voltage generating circuit, and a comparison circuit. The voltage detecting circuit further includes a control circuit for controlling at least one of these circuits so that at least one of these circuits operates intermittently. The intermittent operation of at least one of these circuits reduces power consumption by the overall circuit.

The voltage detecting circuit according to the present invention detects primarily a voltage (hereinafter referred to as a first voltage). The first voltage may be a power supply voltage for the voltage detecting circuit or an integrated circuit carrying the voltage detecting circuit; or an arbitrary power voltage other than the power supply voltage (e.g., a power supply voltage of another integrated circuit or a well bias required for DRAM).

The voltage detecting circuit according to the present invention can be used for the detection of a current such as a rush current of a heater and a latch-up current or for the detection of a frequency. To this end, a current or frequency is converted into a voltage which is in turn subjected to the voltage detection circuit for detection.

Hereinafter, concrete embodiments of the present invention will be described by way of example using a voltage detecting circuit for detecting a power supply voltage.

EXAMPLE 1

Figure 3:
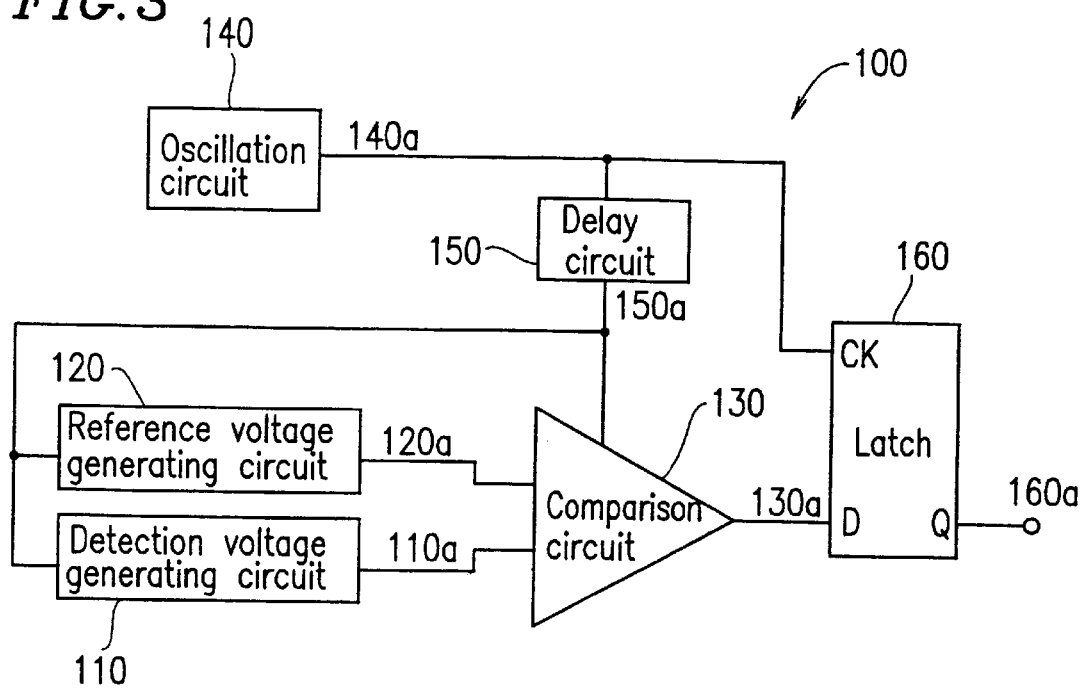
FIG. 3 is a diagram illustrating a configuration of a voltage detecting circuit 100 according to Example 1 of this invention.
Figure 4:
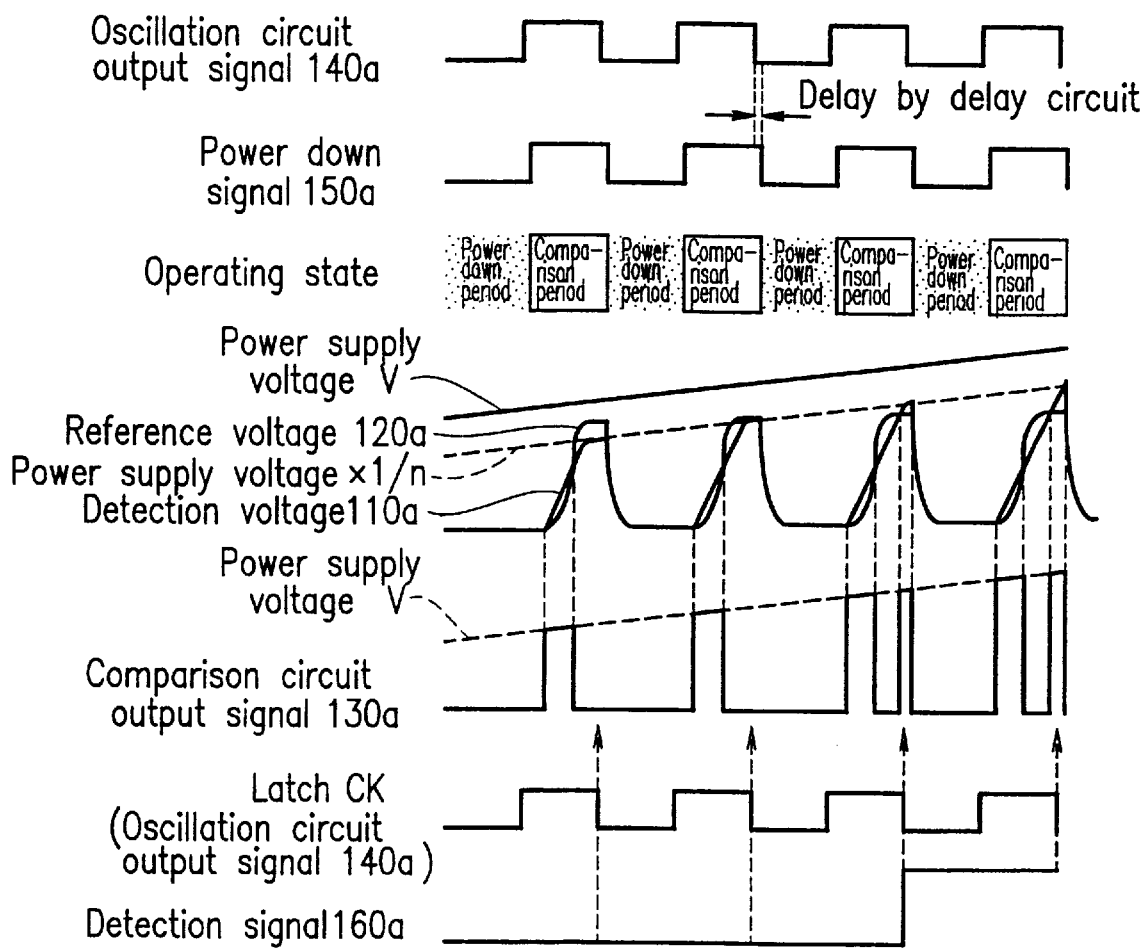
FIG. 4 is a timing chart showing the output of each portion of the voltage detecting circuit 100.

FIG. 3 illustrates a configuration of a voltage detecting circuit 100 of Example 1 for detecting a power supply voltage. FIG. 4 is a timing chart showing the output of each portion of the voltage detecting circuit 100.

The voltage detecting circuit 100 includes a detection voltage generating circuit 110, a reference voltage generating circuit 120, and a comparison circuit 130. The detection voltage generating circuit 110 generates a detection voltage 110a for monitoring a power supply voltage. The detection voltage 110a has a value proportional to the value of the power supply voltage (e.g., one n-th of the power supply voltage, where n>0). The reference voltage generating circuit 120 generates a reference voltage 120a which is constant and independent of the power supply voltage. The comparison circuit 130 includes a differential comparator. The comparison circuit 130 compares the detection voltage 110a with the reference voltage 120a and outputs the result of the comparison as a comparison circuit output signal 130a. A power supply voltage dividing circuit may, for example, be used as the detection voltage generating circuit 110. A bandgap reference circuit may, for example, be used as the reference voltage generating circuit 120.

In Example 1, the voltage detecting circuit 100 further includes an oscillation circuit 140, a delay circuit 150, and a latch circuit 160. The oscillation circuit 140 may include a ring oscillator circuit, for example.

The oscillation circuit 140 outputs a clock signal (oscillation circuit output signal) 140a having a constant frequency as shown in FIG. 4. The phase of the oscillation circuit output signal 140a is delayed at a level of about 5 ns±2 ns by the delay circuit 150 and output as a power down signal 150a as shown in FIG. 4. The power down signal 150a is output from the delay circuit 150. The detection voltage generating circuit 110, the reference voltage generating circuit 120, and the comparison circuit 130 receive the power down signal 150a and operate intermittently in accordance with the power down signal 150a to output the detection voltage 110a, the reference voltage 120a, and the comparison circuit output signal 130a, as shown in FIG. 4.

As is seen from FIG. 4, in a time period during which the power down signal 150a has a HIGH level, the comparison circuit 130 as well as the detection voltage generating circuit 110 and the reference voltage generating circuit 120 carry out the comparison operation. In a time period during which the power down signal 150a has a LOW level, these circuits are in a power down state so that the comparison operation is not carried out. As described above, the detection voltage generating circuit 110, the reference voltage generating circuit 120, and the comparison circuit 130 each have a power down function. By the intermittent comparison operation, the comparison circuit 130 outputs the comparison circuit output signal 130a as shown in FIG. 4. The voltage detection circuit 100 has the same comparison operation as that of the conventional example in the time period during which the power down signal 150a has the HIGH level.

The comparison circuit output signal 130a output from the comparison circuit 130 is latched by the latch circuit 160 at the same time of the above-described intermittent operation. The oscillation circuit output signal 140a of the oscillation circuit 140 is used as a latch clock. This latching generates a continuous detection signal 160a output from the latch circuit 160 as shown in FIG. 4. In Example 1, the delay circuit 150 which adjusts the timing of latching data is provided so that the latch circuit 160 can latch securely the comparison circuit output signal 130a.

The detection signal 160a thus obtained can be used for obtaining information about the power supply voltage to be detected. Examples of such information include the life or voltage drop of a battery used as a main power supply of an information portable device, and the voltage drop of a capacitor power voltage in a backup mode state (e.g., cordless iron). Based on the information, in the case of a battery in an information portable device, for example, when the voltage of the battery is lower than a reference voltage, a part of a circuit inside the information portable device can be stopped to consume power. The detection signal 160a may be used as a reset signal for initialization at power-on or a reset signal for prevention of system runaway when a power supply voltage changes.

In Example 1, assuming that the oscillation circuit output signal 140a output from the oscillation circuit 140 has a pulse having a duty ratio of 1, the power consumption by the overall circuit can be reduced in half without decreasing an operational power supply current of the circuit itself. Adjustment of the duty ratio of the oscillation circuit output signal 140a allows optional variations in the reduction factor of power consumption.

Figure 5:
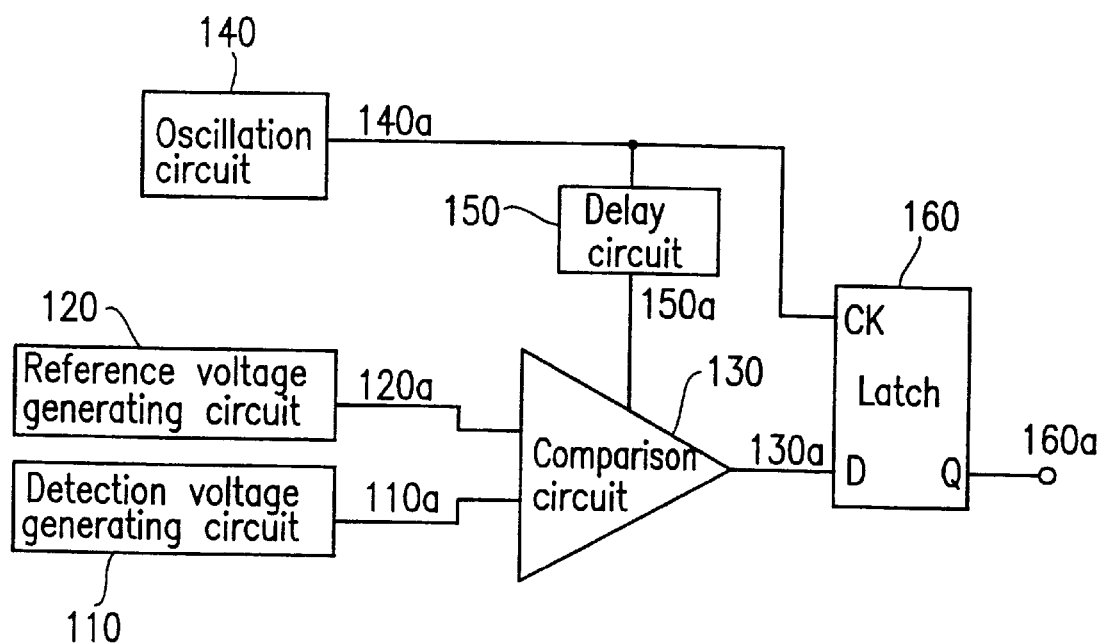
FIG. 5 is a diagram illustrating a configuration of a partially modified version of the voltage detecting circuit 100.

In Example 1, the power down signal 150a is supplied to the detection voltage generating circuit 110, the reference voltage generating circuit 120, and the comparison circuit 130 so that all the circuits operate intermittently. This invention is not limited to this. To achieve an effect of this invention, i.e., a reduction in operational power supply current, only one or more of these circuits may operate intermittently. For example, as shown in FIG. 5, when only the comparison circuit 130 operates intermittently in the voltage detecting circuit, the delay circuit 150 is connected neither to the detection voltage generating circuit 110 nor the reference voltage generating circuit 120, but only to the comparison circuit 130. Similarly, connections between the delay circuit 150, and the detection voltage generating circuit 110 and the reference voltage generating circuit 120 are optionally provided so that only the detection voltage generating circuit 110 and/or the reference voltage generating circuit 120 may operate intermittently. Such modification can be applied to Example 2 described later.

In Example 1, the oscillation circuit 140 and the delay circuit 150 constitute a control circuit for controlling the voltage detecting circuit 100 in such a manner as to obtain the above-described intermittent operation. The oscillation circuit 140 (and the delay circuit 150) generates a pulse signal for obtaining the intermittent operation. According to this invention, at least one of the detection voltage generating circuit 110, the reference voltage generating circuit 120, and the comparison circuit 130 does not operate continuously but intermittently. In view of this, another means may be used as the control circuit instead of the combination of the oscillation circuit 140 and the delay circuit 150, as long as it can supply the above-described power down signal and latch clock signal.

EXAMPLE 2

A voltage detecting circuit for detecting a power supply voltage according to Example 2 of this invention will be described with reference to FIGS. 6 and 7. The voltage detecting device of Example 2 differs from that of Example 1 in that the voltage detecting device of Example 2 is provided with a frequency dividing circuit for dividing the frequency of a pulse signal output from an oscillation circuit. Except for this point, the voltage detecting device of Example 2 has the same structure as that of Example 1.

Figure 6:
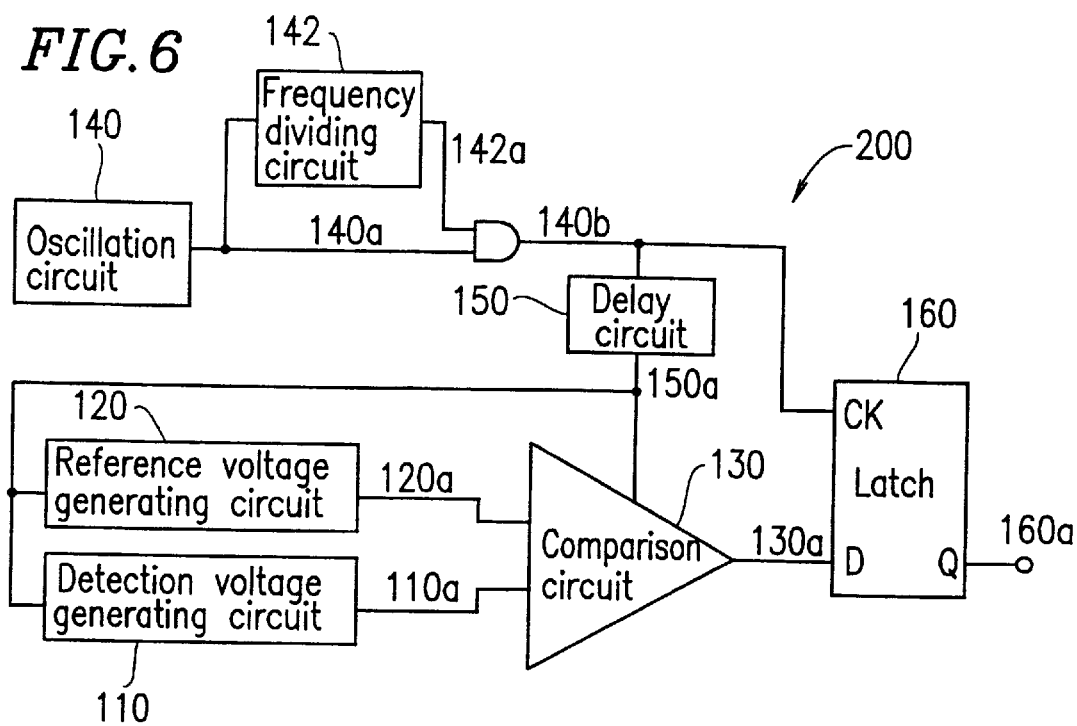
FIG. 6 is a diagram illustrating a configuration of a voltage detecting circuit 200 according to Example 2 of this invention.

FIG. 6 illustrates a configuration of a voltage detecting circuit 200 of Example 2. FIG. 7 is a timing chart showing the output of each portion of the voltage detecting circuit 200. The voltage detecting circuit 200 will be described in detail below.

The voltage detecting circuit 200 includes a detection voltage generating circuit 110, a reference voltage generating circuit 120, and a comparison circuit 130. The detection voltage generating circuit 110 generates a detection voltage 110*a* for monitoring a power supply voltage. The detection voltage 110*a* has a value proportional to the value of the power supply voltage (e.g., one n-th of the power supply voltage where n>0). The reference voltage generating circuit 120 generates a reference voltage 120*a* which is constant and independent of the power supply voltage. The comparison circuit 130 includes a differential comparator. The comparison circuit 130 compares the detection voltage 110*a* with the reference voltage 120*a* and outputs the result of the comparison as a comparison circuit output signal 130*a*. A power supply voltage dividing circuit may, for example, be used as the detection voltage generating circuit 110. A bandgap reference circuit may, for example, be used as the reference voltage generating circuit 120.

The voltage detecting circuit 200 further includes an oscillation circuit 140, a frequency dividing circuit 142, a delay circuit 150, and a latch circuit 160. The oscillation circuit 140 may include a ring oscillator circuit, for example. The oscillation circuit 140 outputs a clock signal (oscillation circuit output signal) 140*a* having a constant frequency as shown in FIG. 7, similar to Example 1.

The frequency dividing circuit 142 divides the frequency of the oscillation circuit output signal 140*a* output from the oscillation circuit 140 and outputs a frequency dividing circuit output signal 142*a* which is a clock signal having a specified frequency. A toggle-type flip-flop (T-FF) circuit may be used as the frequency dividing circuit 142. The oscillation circuit output signal 140*a* and the frequency dividing circuit output signal 142*a* are logically synthesized by an AND gate so that the clock frequency of the oscillation circuit output signal 140*a* is devided by a factor of N (N is a natural number) to obtain a frequency divided signal 140*b* as shown in FIG. 7. The frequency divided signal 140*b* is supplied to the delay circuit 150 and the latch circuit 160.

Figure 7:
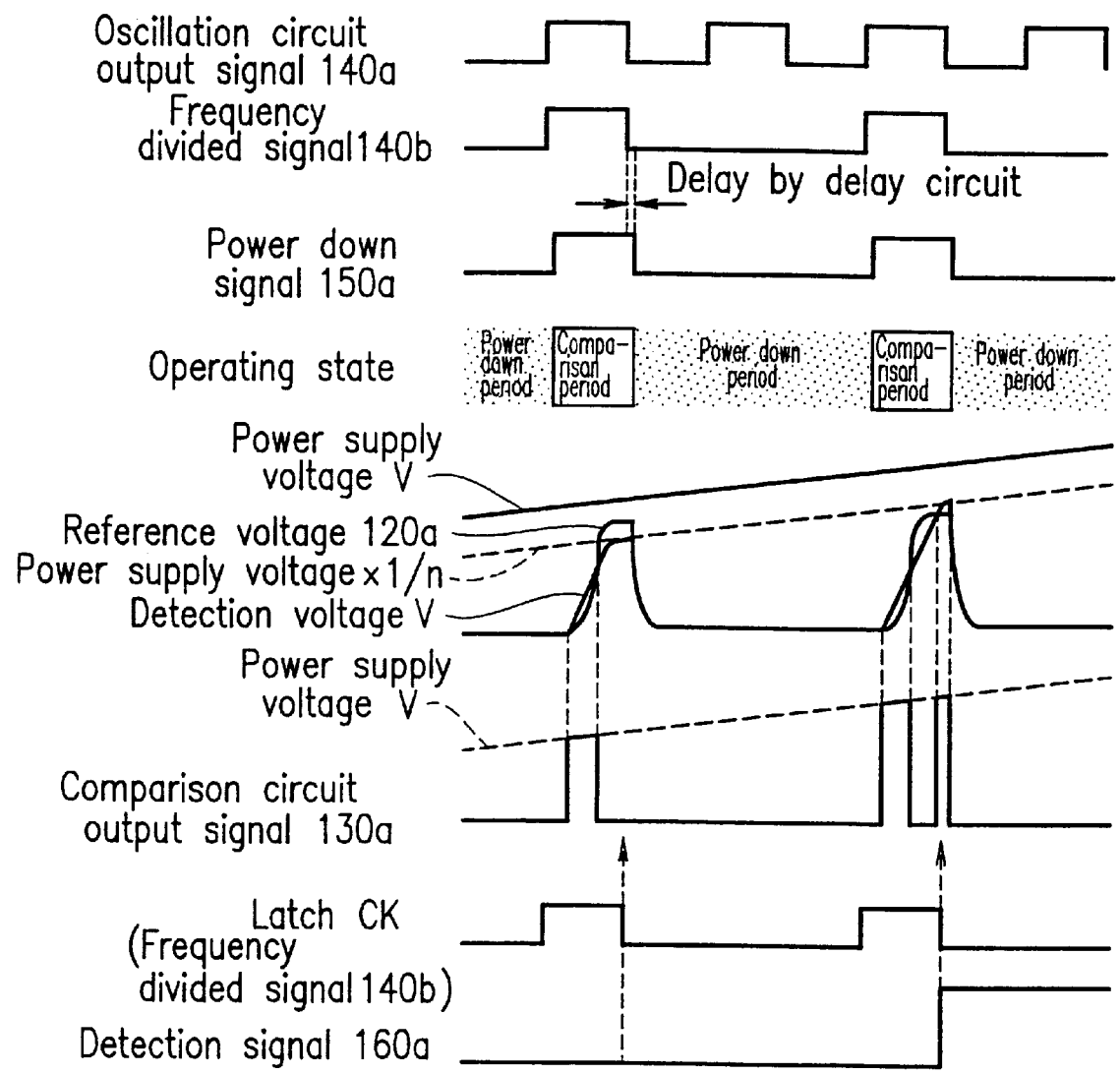
FIG. 7 is a timing chart showing the output of each portion of the voltage detecting circuit 200.

The phase of the frequency divided signal 140*b* is delayed at a level of about 5 ns±2 ns by the delay circuit 150 and output as a power down signal 150*a* as shown in FIG. 7. The power down signal 150*a* is output from the delay circuit 150. The detection voltage generating circuit 110, the reference voltage generating circuit 120, and the comparison circuit 130 receive the power down signal 150*a* and operate intermittently in accordance with the power down signal 150*a* to output the detection voltage 110*a*, the reference voltage 120*a*, and the comparison circuit output signal 130*a* as shown in FIG. 7.

As is seen from FIG. 7, in a time period during which the power down signal 150*a* has a HIGH level, the comparison circuit 130 as well as the detection voltage generating circuit 110 and the reference voltage generating circuit 120 carry out the comparison operation. In a time period during which the power down signal 150*a* has a LOW level, these circuits are in a power down state so that the comparison operation is not carried out. As described above, the detection voltage generating circuit 110, the reference voltage generating circuit 120, and the comparison circuit 130 each have a power down function. By the intermittent comparison operation, the comparison circuit 130 outputs the comparison circuit output signal 130*a* as shown in FIG. 7. The voltage detection circuit 200 has the same comparison operation as that of the conventional example in the time period during which the power down signal 150*a* has the HIGH level.

The comparison circuit output signal 130*a* output from the comparison circuit 130 is latched by the latch circuit 160 at the same time of the above-described intermittent operation. The frequency divided signal 140*b* is used as a latch clock. This latching generates a continuous detection signal 160*a* output from the latch circuit 160 as shown in FIG. 7. In Example 2, the delay circuit 150 which adjusts the timing of latching data is provided in order that the latch circuit 160 can latch securely the comparison circuit output signal 130*a*.

In Example 2, the frequency dividing circuit 142 divides an input signal by a factor of 2, so that power consumption by the overall circuit can be further reduced in half as compared with Example 1. Although a frequency division factor is two in Example 2, the frequency division factor may be another value (three or more). Power consumption by the overall circuit can be reduced to the desired level by setting the frequency division factor N of the frequency dividing circuit to an appropriate value (natural number).

Figure 1:
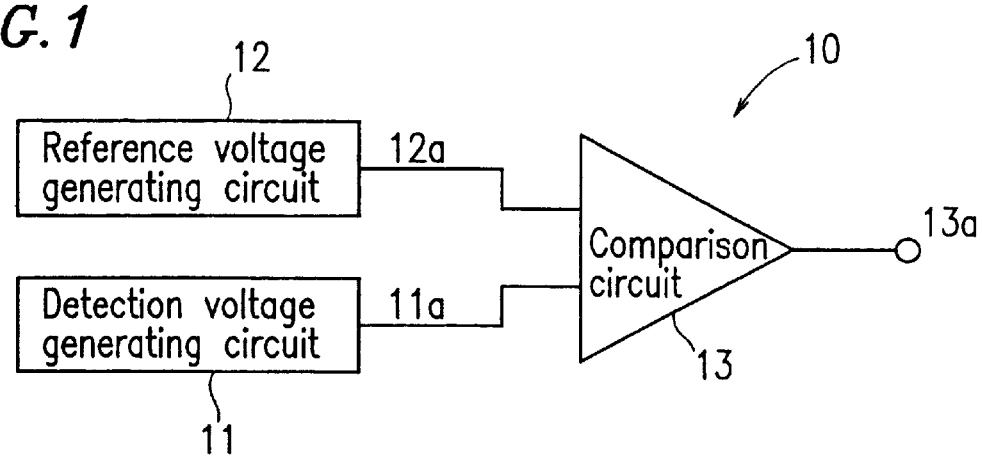
FIG. 1 is a diagram illustrating a configuration of a conventional power supply voltage detecting circuit.
Figure 2:
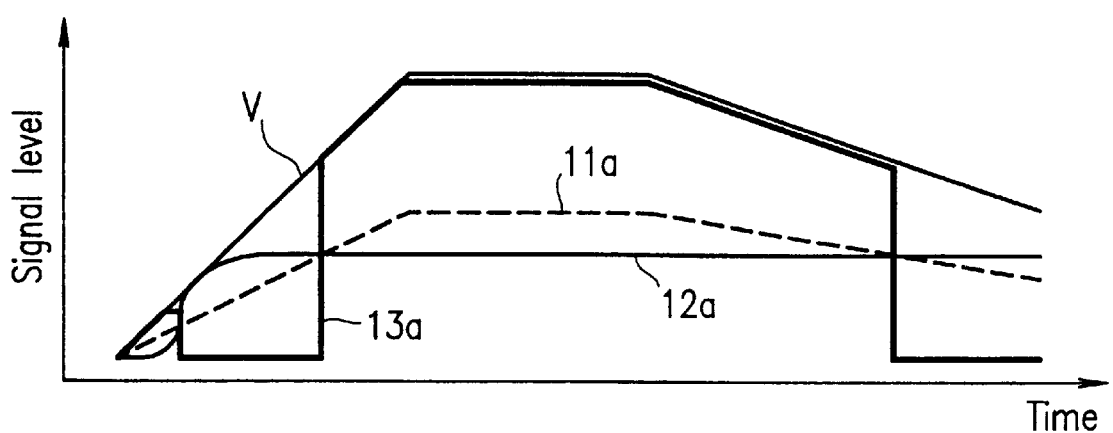
FIG. 2 is a diagram showing signal levels with respect to time of a detection voltage 11a, a reference voltage 12a, a comparison circuit output signal 13a, and a power supply voltage V.

FIG. 8 is a table showing data of the operational power supply current consumed by the voltage detecting circuit 200 of Example 2 and the conventional voltage detecting circuit shown in FIG. 1. In FIG. 8, results for the voltage detecting circuit 200 of Example 2 are obtained where the power supply voltage is 5 V and the frequency division factor of the frequency dividing circuit 142 is, for example, 150 (the clock frequency of the oscillation circuit output signal 140a of the oscillation circuit 140 is divided by a factor of 150), i.e., a detecting operation is performed for about 1 μs in each interval of about 150 μs. As is seen from FIG. 8, in the voltage detecting circuit 200, the overall reduced amount of operational power supply current of the reference voltage generating circuit, the detection voltage generating circuit, and the comparison circuit is greater than the overall increased amount of operational power supply current of the oscillation circuit and the frequency dividing circuit. The frequency dividing circuit 142 having a frequency division factor of 150 leads to a reduction in operational power supply current consumed by the overall circuit to about 2.6% of that of the conventional example shown in FIG. 1. The frequency division factor of the frequency dividing circuit 142 may be set to be an appropriate value depending on the object having the voltage to be detected.

The voltage detecting circuit of this invention includes the control circuit for controlling the voltage detecting circuit in such a manner that at least one of the detection voltage generating circuit, the reference voltage generating circuit, and the comparison circuit operates intermittently. The intermittent operation of the circuit allows a reduction in power consumption by the overall circuit. According to this invention, low power consumption is achieved without a reduction in detection accuracy of the circuit. The use of the voltage detecting circuit of this invention can increase the life of a power supply battery as a main battery.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A voltage detecting circuit for detecting a state of a first voltage, comprising:
   a detection voltage generating circuit for generating a detection voltage depending on the first voltage;
   a reference voltage generating circuit for generating a reference voltage;
   a comparison circuit for comparing the detection voltage with the reference voltage and outputting a result of the comparison as a detection signal; and
   a control circuit for controlling at least one of the detection voltage generating circuit, the reference voltage generating circuit, and the comparison circuit so that at least one of these circuits operates intermittently, in accordance with a clock signal.

2. A voltage detecting circuit according to claim 1, wherein the control circuit includes an oscillation circuit for outputting the clock signal.

3. A voltage detecting circuit according to claim 2 further comprising a frequency dividing circuit for dividing the clock signal output from the oscillation circuit by a factor of N, wherein N is a natural number.

4. A voltage detecting circuit according to claim 1, wherein the circuit operating intermittently is the comparison circuit.

5. A voltage detecting method for detecting a state of a first voltage, comprising the step of intermittently comparing a detection voltage as a monitor of the first voltage with a reference voltage, and outputting a result of the comparison as a detection signal, in accordance with a clock signal.

6. A voltage detecting method according to claim 5, wherein a cycle of the intermittent comparing operation is controlled by the clock signal having a predetermined frequency.

7. A voltage detecting circuit for detecting a state of a first voltage, comprising:
   a detection voltage generating circuit for generating a detection voltage depending on the first voltage;
   a reference voltage generating circuit for generating a reference voltage;
   a comparison circuit for comparing the detection voltage with the reference voltage and outputting a result of the comparison as a detection signal; and
   a control circuit for controlling at least the comparison circuit, so that the comparison circuit operates intermittently, in accordance with a clock signal.

8. A voltage detecting circuit for detecting a state of a first voltage, comprising:
   a detection voltage generating circuit for generating a detection voltage depending on the first voltage;
   a reference voltage generating circuit for generating a reference voltage;
   a comparison circuit for comparing the detection voltage with the reference voltage and outputting a result of the comparison as a detection signal; and
   a control circuit for controlling at least the detection voltage generating circuit and the reference voltage generating circuit, so that the detection voltage generating circuit and the reference voltage generating circuit operate intermittently, in accordance with a clock signal.

* * * * *